United States Patent [19]

Takagi et al.

[11] 3,989,962

[45] Nov. 2, 1976

[54] NEGATIVE-RESISTANCE SEMICONDUCTOR DEVICE

[75] Inventors: Hiromitsu Takagi, Muko; Gota Kano, Nagaoka-kyo, both of Japan

[73] Assignee: Matsushita Electronics Corporation, Kadoma, Japan

[22] Filed: Mar. 5, 1975

[21] Appl. No.: 555,676

[30] Foreign Application Priority Data

Mar. 8, 1974 Japan.............................. 49-27538

[52] U.S. Cl............................ 307/304; 307/202 R; 307/308; 307/324

[51] Int. Cl.²................... H03K 4/83; H03K 17/72; H02H 9/00; H03K 3/353

[58] Field of Search ........... 307/251, 258, 283, 304, 307/324, 308, 309, 311, 202

[56] References Cited

UNITED STATES PATENTS

| | | | |
|---|---|---|---|
| 3,369,129 | 2/1968 | Wolterman | 307/304 X |
| 3,461,312 | 8/1969 | Farber et al. | 307/304 X |
| 3,603,811 | 9/1971 | Day | 307/304 X |
| 3,605,728 | 9/1971 | Ogle | 307/304 X |
| 3,732,482 | 5/1973 | Marek | 307/304 X |

OTHER PUBLICATIONS

"Unifets as Voltage-Controlled Resistors," published by Siliconix, incorporated, 1963 (7/15/63), 3 pages.
Ostefjells, "Negative Resistance Circuit Using Two Complementary Field Effect Transistors," Proc. of IEEE, vol. 53, No. 4, p. 405; 4/1965.
Hill et al., "Synthesis of Electronic Bistable Circuits," IEEE Trans. On Circuit Theory; pp. 25–35; 3/1963.

Primary Examiner—John S. Heyman
Assistant Examiner—Larry N. Anagnos
Attorney, Agent, or Firm—Cushman, Darby & Cushman

[57] ABSTRACT

Both source-electrodes (S1 and S2) or both drain-electrodes of a pair of field-effect transistors (FETs) (F1 and F2) of n-channel type and p-channel type, respectively, both to be electrically actuated in a depletion mode are connected to each other, or the source of one FET and the drain of the other FET are connected to each other, through a variable resistance element (F3) inbetween, whereby the pair of FETs (F1 and F3) are series-connected through the variable resistance element (F3) inbetween, the gate-electrode (g1 or g2) of each FET is connected to the drain-electrode (d2 or d1) or the source-electrode of the other FET (F2 or F1) that is not connected to the variable resistance element (F3), and a pair of external terminals (1 and 2) are connected to said gate electrodes (g1, g2) those are connected to said drain electrodes (d2 and d1) or source electrodes.

When a voltage of specified range is applied across both non-series-connected electrodes, i.e., the two external terminals, the resulting voltage-current characteristic presents a so-called dynatron-type characteristic, producing a negative-resistance phenomenon, and a curve of voltage-current characteristic changes responding to the value of control signal to the variable resistance element.

Since this device is a negative resistance of variable characteristic this device can be utilized for switching, signal relaying, memorization and other various controlling or data processing uses.

8 Claims, 6 Drawing Figures

NEGATIVE-RESISTANCE SEMICONDUCTOR DEVICE

BACKGROUND OF THE INVENTION

This invention relates to an improved negative-resistance semiconductorr device comprising complementary field-effect transistors (hereinafter referred to as FETs), and particularly concerns a unitary negative-resistance circuit device with controllable characteristic of its negative resistance.

Conventional negative-resistance semiconductor devices are known, in one of which a single-element type is realized by a physical mechanism, and in another of which a composite type is composed of a plural number of discrete semiconductor elements wired together to form a circuit. The former type is best represented by that showing N-figured negative-resistance characteristic such as tunnel diodes, Gunn diodes, etc. and that showing S-figured negative-resistance characteristic such as thyristers, uni-junction transistors, etc. The latter type is best represented by a flip-flop circiut showing S-figured characteristic or circuit composed of a serially connected pair of complementary field-effect transistors showing N-figured characteristic.

Out of the abovementioned known devices, that showing the S-figured characteristic is in wide practial use now, but that showing the N-figured characteristic is used only for special uses. The main reason therefor is that in the conventional N-figured negative-resistance single-element realized by the physical mechanism of the tunnel diode, Gunn diode, etc. of the former type, the electrical characteristics are so specified that very limited applications only could be available.

The aforementioned N-figured negative resistance device composed of serially connected complementary field-effect transistors is proposed by IEEE Transaction on circiut theory, March 1963, page 25–35 and by proceedings of IEEE, April 1965, page 404. The proposed device comprises a pair of field-effect transistors of p-channel type and n-channel type, respectively, both to be electrically actuated in depletion mode and connected source-to-source to each other, wherein the gate electrode of each FET is connected to the drain electrode of the other FET. In such device, the characteristic, i.e., first, second and third threshold values are determined by component FETs, and therefore, are fixed. However, there is a need of providing negative resistance devices of various characteristics.

SUMMARY OF THE INVENTION

The present invention purports to provide a negative-resistance device capable of changing its characteristic.

The other object of the present invention is to provide negative-resistance devices, characteristics of which are controlled by input voltage, input light, input force, etc.

DETAILED DESCRIPTION OF THE INVENTION

The device of the present invention comprises a complementary pair of unipolar transistors and a variable resistance element, and has dynatron type voltage-current characteristic which is variable responding to resistance of the variable resistance device.

Figure 1:
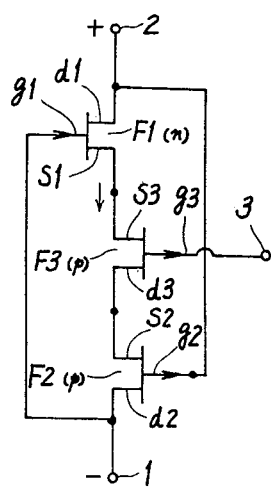
FIG. 1 is a circuit diagram of one example of the present invention.

FIG. 1 shows a first example of the present invention. In FIG. 1, the sources S1 and S2 of a complementary pair of unipolar transistors, for instance, an n-channel junction type depletion-mode field-effect transistor F1 and a p-channel junction type depletion-mode field-effect transistor F2, are connected to each other through a variable resistance element, for instance, another p-channel junction type field-effect transistor F3. The gate $g1$ of the n-channel field-effect transistor F1 is connected to a drain $d2$ of the p-channel field-effect transistor F2, and the gate $g2$ of the p-channel field-effect transistor F2 is connected to the drain $d1$ of the n-channel field-effect transistor F1. An anode terminal 2 and a cathode terminal 1 are connected to the drain $d1$ and the drain $d2$ of the field-effect transistors F1 and F2, respectively, and a control terminal 3 is connected to the gate $g3$ of the third field-effect transistor F3.

Figure 2:
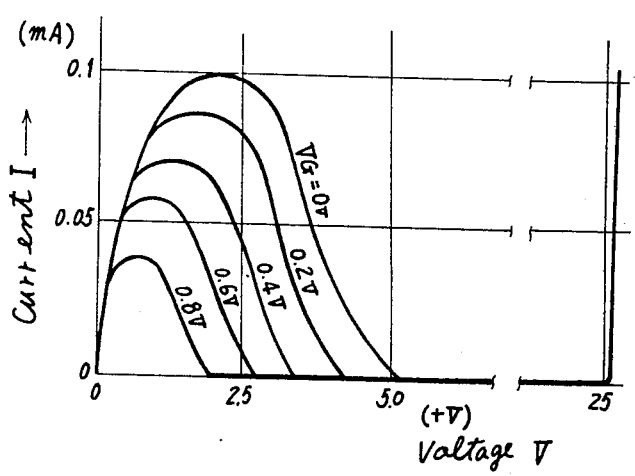
FIG. 2 is a graph showing the voltage-current characteristic curves of the example of FIG. 1.

Operation of the circuit of FIG. 1 is as follows:

When a voltage V is applied across two outer terminals 2 and 1, i.e., across one drain electrode $d1$ and the other drain electrode $d2$ of the circuit of FIG. 1 (with positive potential on the side of drain electrode $d1$), a known Λ (lambda, a Greek character)-type current-voltage characteristic as shown in FIG. 2 is obtained between the voltage V and source current I. As is seen in FIG. 2, for a time from the starting voltage 0, the current I increases showing positive resistance characteristic as the voltage increases, but the current also shows gradually a saturation characteristic, and after the current exceeds the voltage of peak current point (i.e., the first threshold voltage), the current gradually declines as the voltage increases, showing a so-called negative-resistance characteristic. When the voltage exceeds the second threshold voltage, the current I enters the cut-off state. This cut-off state of the current continues until the voltage reaches a break-over voltage where one of the FETs begins to break-down. When the voltage passes over the break-over point, the current sharply rises due to a break-down current. In the circuit constitution of FIG. 1, there are positive resistance region where the curve gradient is positive between V=0 and the peak current point on every curve, the cut-off region where the current is cut-off between the second threshold voltage and the break-over point and the negative resistance region where the curve gradient is negative between the peak current point and the second threshold voltage.

As shown in the characteristic curves of FIG. 2, the characteristic curve shrinks as an input voltage VG between the control terminal 3 and the cathode terminal 1 increases, and expands as the input voltage VG decreases. Such variation of a characteristic curve for various control voltages as parameter is caused by change of resistance of the third field-effect transistor F3 by the change of the control voltage at the terminal 3.

As a result of the abovementioned variation of the curve, first and second threshold voltages vary.

Figure 3:
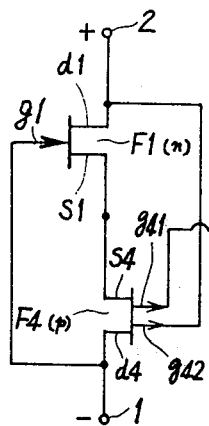
FIG. 3 is a circuit diagram of another example of the present invention.

FIG. 3 shows a second example of the present invention. In FIG. 3, a field-effect transistor F1 is the same as that of the example in FIG. 1, and another field-effect transistor F4 is a p-channel junction type depletion-mode field-effect tetrode transistor having a first gate g41 and a second gate g42. The first gate G41 is connected to a control terminal 3 so as to receive a control voltage, and the second gate g42 is connected to the drain d1 of the first field-effect transistor F1 similarly to the gate g2 of the example of FIG. 1.

As can be understood by comparing the circuit of FIG. 3 with that of FIG. 1, the tetrode field-effect transistor F4 serves as a combination of the field-effect transistors F3 and F2, and therefore, the voltage-current characteristic curves for the control voltage to the control terminal is the same as those of FIG. 2.

It is of course possible to use in the circuit of FIG. 1 an n-channel junction type depletion-mode field-effect transistor as the variable resistance element F3.

Figure 4:
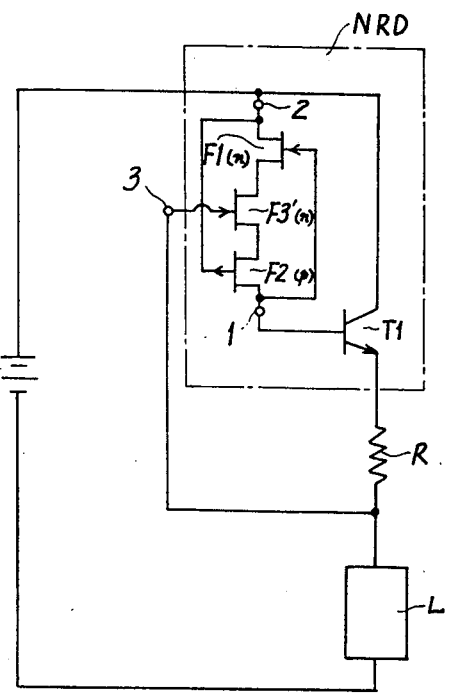
FIG. 4 is a circuit diagram of an over-current protection circuit employing the negative-resistance device of the present invention.

FIG. 4 shows an example of over-current protector circuit employing the negative resistance device NRD of the present invention.

In this example, the negative resistance device NRD consists of a first depletion-mode field-effect transistor F1 of n-channel junction type, a second depletion-mode field-effect transistor F2 of p-channel junction type and a third field-effect transistor F3 as a variable resistance device of n-channel junction type. In this negative resistance NRD, the voltage-current characteristic curve shrinks when the control voltage impressed to the control terminal 3 becomes larger in the negative range against the cathode terminal 1. In this over-current protector circuit, a collector-emitter circuit of a switching transistor T1, a series resistor R and a load L are connected in series across the positive and negative terminals of a D.C. power source E, and the anode and cathode terminals of the negative resistance device NRD are connected to the collector and the base of the switching transistor. The resistor R is for detecting undesirable increase in the load current and impressing it to the control terminal 3 as a feed-back signal.

Figure 5:
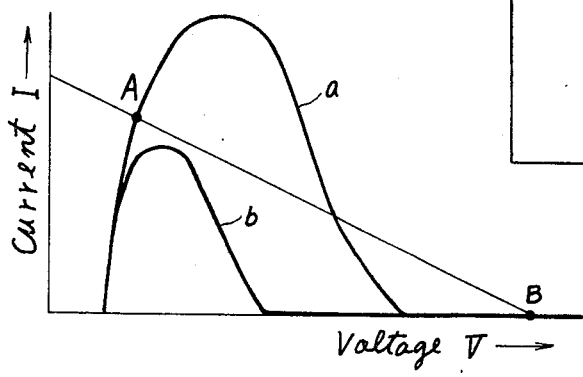
FIG. 5 is a graph showing the voltage-current characteristic curves of the circuit of FIG. 4.

Operation of the circuit of FIG. 4 is as follows:

When the load current of the load L is of an ordinary amount $I_0$, the voltage appearing across the resistor R, which voltage is proportional to the load current, is within a preset voltage. This voltage across the resistor R, together with base-emitter voltage of the transistor 4, determines the control voltage between the control terminal 3 and the cathode terminal 1. By suitably selecting the resistance of the resistor R, the control voltage between the terminals 3 and 1 is selected in such a value that, in the V-I characteristic curve $a$ shown in FIG. 5 of the negative resistance device NRD, the voltage across the anode terminal 2 and the cathode terminal of the negative resistance device NRD, i.e., the voltage between the collector and the base of the transistor T1, is smaller than the abovementioned peak voltage value of the curve. By such selection, the negative resistance device NRD is at an operation point A in the positive resistance state, and therefore the base current flows through the negative resistance device NRD to the base of the transistor T1, thereby making the collector-emitter circuit of the transistor T1 conductive and allowing the load current to flow in the load L.

When the load current increases and exceeds a preset level, the voltage drop across both ends of the series resistor R increases and therefore, the voltage across the control terminal 3 and the emitter of T1 is increased with negative sign. Therefore, the V-I characteristic curve of the negative resistance device NRD shrinks as shown by $b$ in FIG. 5, and hence, the operating point switches to a point B in the cut-off state of the characteristic. Accordingly, the base current of the transistor T1 is cut-off, and the transistor 1 cuts off the load current.

The complementary pair of the uni-polar transistors F1 and F2 may be MOS type, i.e., insulated-gate type field-effect transistors instead of the junction type field-effect transistors shown in the foregoing examples. In each of the p-channel and n-channel field-effect transistors, the connections of source and drain electrodes can be exchanged between them.

The order of connection of the p-channel type field-effect transistor and the n-channel type field-effect transistor may be reversed.

As the variable resistance device connected between the complementary pair of field-effect transistors other than the abovementioned field-effect transistors F3 or F3', any known variable resistance element may be employed.

Figure 6:
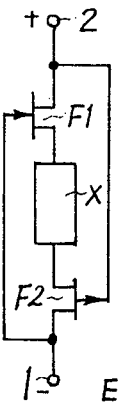
FIG. 6 is a circuit diagram of still another example of the present invention.

FIG. 6 shows a circuit diagram comprising a variable resistance element X connected between the two uni-polar transistors F1 and F2. The variable resistance element X may be a bi-polar transistor, a pressing-force sensitive or strain-sensitive element, a light-sensitive element, for instance, a phototransistor or a solar battery or a magnetic-field-sensitive element. In case of the pressing-force or strain-sensitive element, light-sensitive element or magnetic-field sensitive element, there is no need of providing the control terminal.

Since the field-effect transistors and the variable resistance element constituting the negative resistance device of the present invention are semiconductor devices, the device of the present invention is suitable to be constituted in one monolithic wafer as an integrated circuit.

What is claimed is:

1. A two terminal negative resistance device having first and second external terminals and capable of continuously changing its negative resistance characteristic, comprising a complementary pair of transistors comprising a depletion mode n-channel unipolar transistor and a depletion mode p-channel unipolar transistor, an active circuit element having at least two terminals and an input and functioning to change its resistance between said two terminals in response to an input signal, each of said unipolar transistors having a gate and a pair of source-drain output circuit terminals, one of the output circuit terminals of said p-channel unipolar transistor being connected by a first connection to one of said two terminals of said active circuit element, one of the output circuit terminals of said n-channel unipolar transistor being connected by a second connection to the other of said two terminals of said active circuit element, the gates of each of said unipolar transistors being connected by respective third and fourth connections to the other output circuit terminal of the other unipolar transistor, and said third and fourth connections being respectively connected to said first and second external terminals, whereby changing resistance of the active circuit element in response to an input signal changes the negative resistance characteristic of said negative resistance device.

2. A negative resistance device according to claim 1 wherein said active circuit element comprises a field-effect transistor whose source and drain terminals constitute said two terminals, and the gate of which comprises an input to which an input signal can be applied for changing the resistance of said active circuit element.

3. A negative resistance device as claimed in claim 1, wherein said unipolar transistors and said active circuit element are formed in a single monolithic wafer to constitute an integrated circuit.

4. The negative resistance device of claim 1, wherein said active circuit element is a bi-polar transistor.

5. The negative resistance device of claim 1, wherein said active circuit element is a phototransistor.

6. The negative resistance device of claim 1, wherein said active circuit element is a force sensitive semiconductor element.

7. The negative resistance of claim 1, wherein said active circuit element is a magnetic-field sensitive semiconductor element.

8. A negative resistance device comprising a unipolar transistor having gate, source and drain electrodes and a unipolar tetrode transistor having source, drain, and first and second gate electrodes, channel-conductivities of the unipolar transistor and that of the unipolar tetrode transistor being opposite to each other, one of the source and drain electrodes of said unipolar transistor being connected to one of the source and drain electrodes of said unipolar tetrode transistor, the gate electrode of said unipolar transistor and one of the gate electrodes of said unipolar tetrode transistor being connected to the other of the source and drain electrodes of said unipolar tetrode transistor and said unipolar transistor, respectively, the other gate electrode of said unipolar tetrode transistor being connected to a control terminal to which a control voltage can be applied, and a pair of external terminals being connected to said other of the source and drain electrodes of said unipolar transistor and said other of the source and drain electrodes of said unipolar tetrode transistor, respectively.

* * * * *